US009956590B2

(12) United States Patent
Horvath et al.

(10) Patent No.: US 9,956,590 B2
(45) Date of Patent: May 1, 2018

(54) SHAKER

(71) Applicant: STRATEC Biomedical AG, Birkenfeld (DE)

(72) Inventors: Tibor Horvath, Straubenhardt (DE); Ruediger Retzlaff, Neuenbuerg (DE); Martin Trump, Pforzheim (DE)

(73) Assignee: STRATEC Biomedical AG, Birkenfeld (DE)

( * ) Notice: Subject to any disclaimer, the term of this patent is extended or adjusted under 35 U.S.C. 154(b) by 502 days.

(21) Appl. No.: 14/674,595

(22) Filed: Mar. 31, 2015

(65) Prior Publication Data

US 2015/0273525 A1 Oct. 1, 2015

(30) Foreign Application Priority Data

Apr. 1, 2014 (GB) .................................. 1405835.8

(51) Int. Cl.

| | |
|---|---|
| ***H01L 41/09*** | (2006.01) |
| ***B06B 1/06*** | (2006.01) |
| ***B01F 11/00*** | (2006.01) |
| ***B01F 11/02*** | (2006.01) |

(52) U.S. Cl.

CPC .......... *B06B 1/0607* (2013.01); *B01F 11/004* (2013.01); *B01F 11/0014* (2013.01); *B01F 11/0291* (2013.01); *B01F 2215/0037* (2013.01)

(58) Field of Classification Search

CPC .. B06B 1/0607; B01F 11/0014; B01F 11/004; B01F 11/0291; H01L 41/09; H02N 2/00; H04R 17/00

USPC .... 310/311, 323.01, 323.02, 323.06, 323.18, 310/328

See application file for complete search history.

(56) References Cited

U.S. PATENT DOCUMENTS

| | | | | |
|---|---|---|---|---|
| 4,655,083 | A * | 4/1987 | Chubachi | G01N 29/06 73/606 |
| 5,347,133 | A | 9/1994 | Toki et al. | |
| 6,322,243 | B1 | 11/2001 | Bull | |
| 2004/0005722 | A1 | 1/2004 | Takeuchi et al. | |
| 2004/0033588 | A1 | 2/2004 | Su et al. | |
| 2006/0172065 | A1* | 8/2006 | Carlotto | B01J 2/006 427/212 |
| 2006/0275883 | A1 | 12/2006 | Rathgeber et al. | |
| 2010/0148631 | A1* | 6/2010 | Szuki | G11B 9/1436 310/323.17 |

FOREIGN PATENT DOCUMENTS

| | | | | |
|---|---|---|---|---|
| JP | 07-257724 | A * | 3/1994 | B65G 27/24 |
| JP | 2001327846 | | 11/2001 | |

(Continued)

*Primary Examiner* — Thomas Dougherty

(74) *Attorney, Agent, or Firm* — 24IP Law Group; Timothy R DeWitt

(57) ABSTRACT

A piezo shaker for shaking a probe is disclosed. The piezo shaker comprises a platform operatively connected with at least one piezo element, wherein the at least one piezo element deforms for controlled movement of the platform, wherein the piezo shaker further comprises transmission means connecting the at least one piezo element and the platform, and wherein the transmission means transmit the movement to the platform. The piezo shaker may comprise two piezo elements, arranged to operate along different directions, in particular perpendicularly.

19 Claims, 9 Drawing Sheets

(56) References Cited

FOREIGN PATENT DOCUMENTS

| | | | |
|---|---|---|---|
| JP | 2007117830 | | 5/2007 |
| JP | 2010117250 | | 5/2010 |
| WO | 2005107931 | A1 | 11/2005 |
| WO | 2011113938 | | 9/2011 |

* cited by examiner

SHAKER

BACKGROUND OF THE INVENTION

Field of the Invention

The field of the invention relates to a piezo shaker and a method for shaking a probe.

Brief Description of the Related Art

Automated analyser systems for use in clinical diagnostics and life sciences are produced by a number of companies. For example, the Stratec Biomedical AG, Birkenfeld, Germany, produces a number of devices for specimen handling and detection for use in automated analyser systems and other laboratory instrumentation.

Preparation and analysis of samples is part of everyday practice in laboratory or clinical work. Often the preparation requires mixing of several components of a sample. Mixing can be required, for instance, after a further component to a sample has been added, or in the case of particles suspended in a liquid sample.

Available solutions for mixing of samples include the use of electric motors for producing a shaking movement of a sample in a container. The electric motors comprise stepper, electronically commutated or direct current motors. Solutions using permanent or electromagnet are also known.

When using electric motors or magnets, movement patterns, such as linear or orbital movements, are often fixed or cumbersome to change and adjust. In other cases, the number of available choices is limited. Furthermore, achievable frequencies conventionally are limited towards the high-frequency ranges. Wear and friction in conventional drives for shaking probes is a further problem.

Another solution of the state of the art is presented in WO 2011/113938 A1, which discloses an agitator by vibrations including an annular resonator to which is applied a vibratory stress by piezoelectric transducers. The preferred stress shape is a bending of the ring perpendicularly to its plane in order to excite inherent modes at relatively low frequencies. The use of a solid annular transmitter enables the vibrations to be satisfactorily controlled in order to maintain satisfactory transmission to the sample to be agitated, and to focus them on it. The excitation frequencies are frequencies inherent to the ring or to the tank. The piezoelectric transducers expand and contract in order to transmit the movement to the tank comprising a sample. The movement is thus not transmitted to the platform but instead transmitted to the tank. The tank is being bent in order to mix the sample. The transduced movement is not a controlled movement but a vibrational movement.

OBJECT OF THE INVENTION

It is an object of the present invention to provide a shaker at reasonable cost for reliably producing a multitude of shaking movements for mixing a probe. It is further an object to provide a shaker moving the probe at high frequencies, with low frictional wearing, inherent movement control and low noise emission.

SUMMARY OF THE INVENTION

The present disclosure relates to a piezo shaker. The piezo shaker comprises a platform operatively connected with at least one piezo element, wherein the at least one piezo element deforms for controlled movement of the platform, wherein the piezo shaker further comprises transmission means connecting the at least one piezo element and the platform, and wherein the transmission means transmit the movement to the platform.

The piezo shaker may comprise two piezo elements arranged to operate along different directions for moving the platform.

The two piezo elements may be arranged to operate perpendicularly.

The piezo shaker may further comprise at least one spring bar moveably connected to and supporting the platform.

The transmission means may be connected to the at least one spring bar.

The piezo shaker may further comprise a rectangular base, the piezo elements being arranged to operate at approximately 45 degrees with respect to an outline of the rectangular base.

The piezo shaker may further comprise a power source electrically connected to the piezo elements.

The piezo shaker may further comprise a controller electrically connected to the power source for controlling the power fed to the piezo elements.

The controller may further comprise a storage for storing patterns of operation of the piezo elements.

The piezo shaker may further comprise a sensor for sensing the position of the at least one piezo element.

A method for shaking a probe is disclosed. The method comprising providing the above piezo shaker, placing the probe on the platform, driving the platform to move by means of the at least one piezo element, controlling movement of the platform.

The platform may be driven to move by means of two piezo elements, operating along different directions.

The two piezo elements may operate perpendicularly.

The controlling may comprise independently driving the piezo elements to oscillate.

The controlling may further comprise predetermining frequencies, phases and amplitudes of the piezo elements.

The ratio of the frequencies of the piezo elements may be a rational number.

The controlling may further comprise driving the platform to move resonantly.

The controlling may further comprise monitoring output voltages generated in the piezo elements.

Use of the above piezo shaker for shaking a probe is disclosed.

The use may comprise two piezo elements, arranged to operate along different directions for shaking a probe.

The use may comprise the two piezo elements being arranged to operate perpendicularly.

Still other aspects, features, and advantages of the present invention are readily apparent from the following detailed description, simply by illustrating a preferable embodiments and implementations. The present invention is also capable of other and different embodiments and its several details can be modified in various obvious respects, all without departing from the spirit and scope of the present invention. Accordingly, the drawings and descriptions are to be regarded as illustrative in nature, and not as restrictive. Additional objects and advantages of the invention will be set forth in part in the description which follows and in part will be obvious from the description, or may be learned by practice of the invention.

SUMMARY OF THE FIGURES

For a more complete understanding of the present invention and the advantages thereof, reference is now made to the following description and the accompanying drawings, in which.

DETAILED DESCRIPTION OF THE INVENTION AND THE FIGURES

The invention will now be described on the basis of the drawings. It will be understood that the embodiments and aspects of the invention described herein are only examples and do not limit the protective scope of the claims in any way. The invention is defined by the claims and their equivalents. It will be understood that features of one aspect or embodiment of the invention can be combined with a feature of a different aspect or aspects and/or embodiments of the invention.

Figure 1:
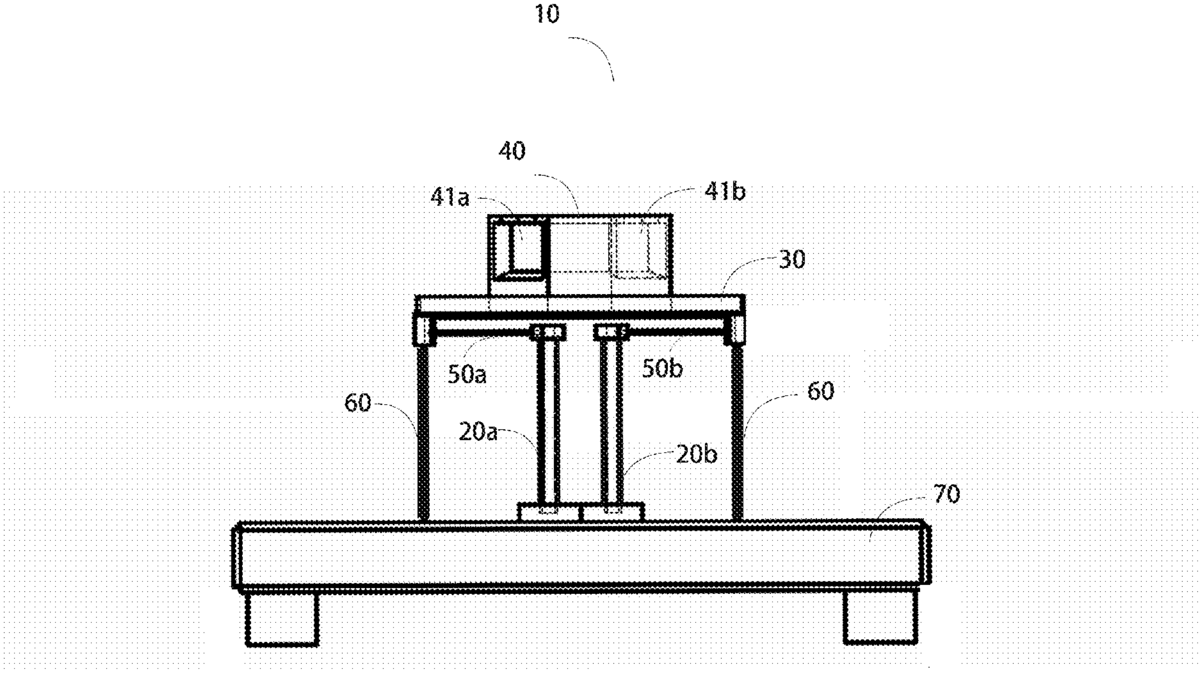
FIG. 1 shows an elevation view of a piezo shaker according to an aspect of the present invention
Figure 2:
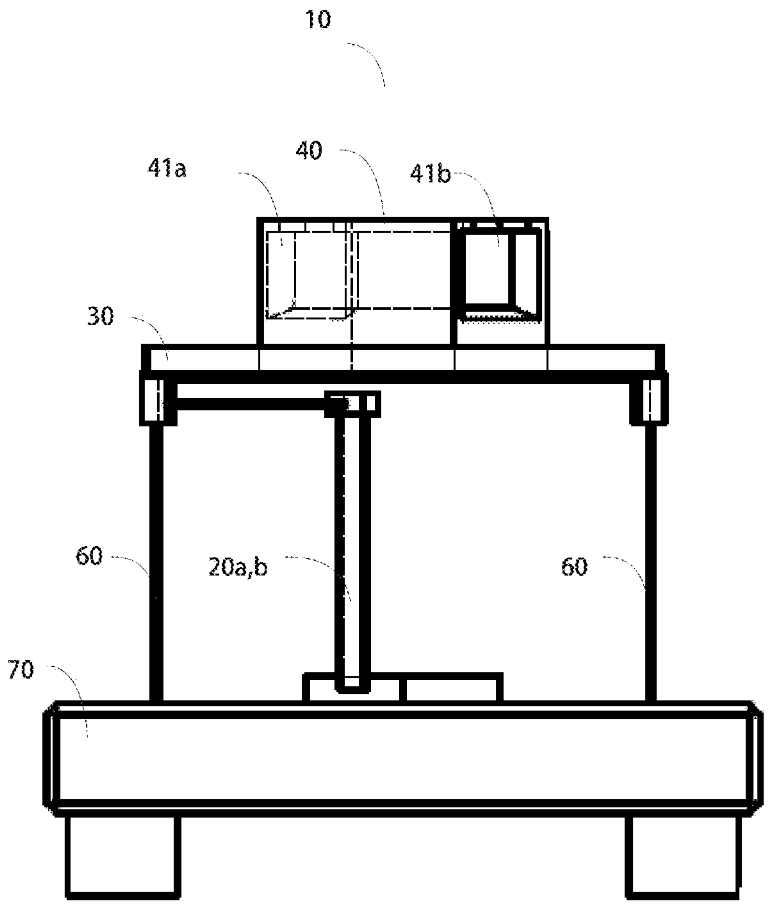
FIG. 2 shows the piezo shaker as shown in FIG. 1, viewed from an angle perpendicular to the direction of view in FIG. 1.

In FIGS. 1 to 4 a piezo shaker 10 is shown according to one aspect of the invention. The piezo shaker 10 comprises a platform 30 and two piezo elements. The two piezo elements in FIG. 1 are a first piezo element 20*a* and a second piezo element 20*b*. The piezo shaker 10 according to the present invention is not limited to two piezo elements. The piezo shaker 10 may also comprise one piezo element or three piezo elements, or any number of piezo elements conceivably suitable for shaking a probe.

The first piezo element 20*a* and the second piezo element 20*b* are operatively connected with the platform 30. The first piezo element 20*a* and/or the second piezo element 20*b* may be actuated to deform and thereby drive the platform 30 to move. By applying driving voltages to the first piezo element 20*a* and/or the second piezo element 20*b*, mechanical strain generated within the first piezo element 20*a* and/or the second piezo element 20*b* results in deforming of the first piezo element 20*a* and/or the second piezo element 20*b*. The deforming of the first piezo element 20*a* and/or the second piezo element 20*b* is transmitted to the platform 30 by operatively connecting the first piezo element 20*a* and the second piezo element 20*b* with the platform 30.

The use of piezo elements enables working in a range of high frequencies, such as ultrasonic frequencies. Piezo elements can furthermore be of small sizes. Therefore, shakers using the two piezo elements furthermore require little space as compared to electric motors conventionally used in shakers.

A probe (not shown) may be placed on the platform 30. In FIG. 1, a rack 40 with a first placing position 41*a* and a second placing position 41*b* is shown. The first placing position 41*a* and the second placing position 41*b* can receive containers such as flasks, glasses, tubes, which may be used to contain the probe and to place the probe on the platform 30.

Instead of bending or deforming a container comprising a probe or sample, the platform of the present invention is being moved in order to shake the probe. The platform may be moved in two dimensions.

The piezo elements of the present invention deform and do not expand or contract. The movement of the platform can thus be better controlled and influenced more directly. In case of a two-dimensional movement, both dimensions can be controlled individually regarding both the frequency and the amplitude of the movement.

Placing the probes on top of the platform 30 makes the piezo shaker 10 according to the invention suitable for use in combination with liquid dispensing systems in which the liquid is dispensed from above in a vertical direction.

Figure 4:
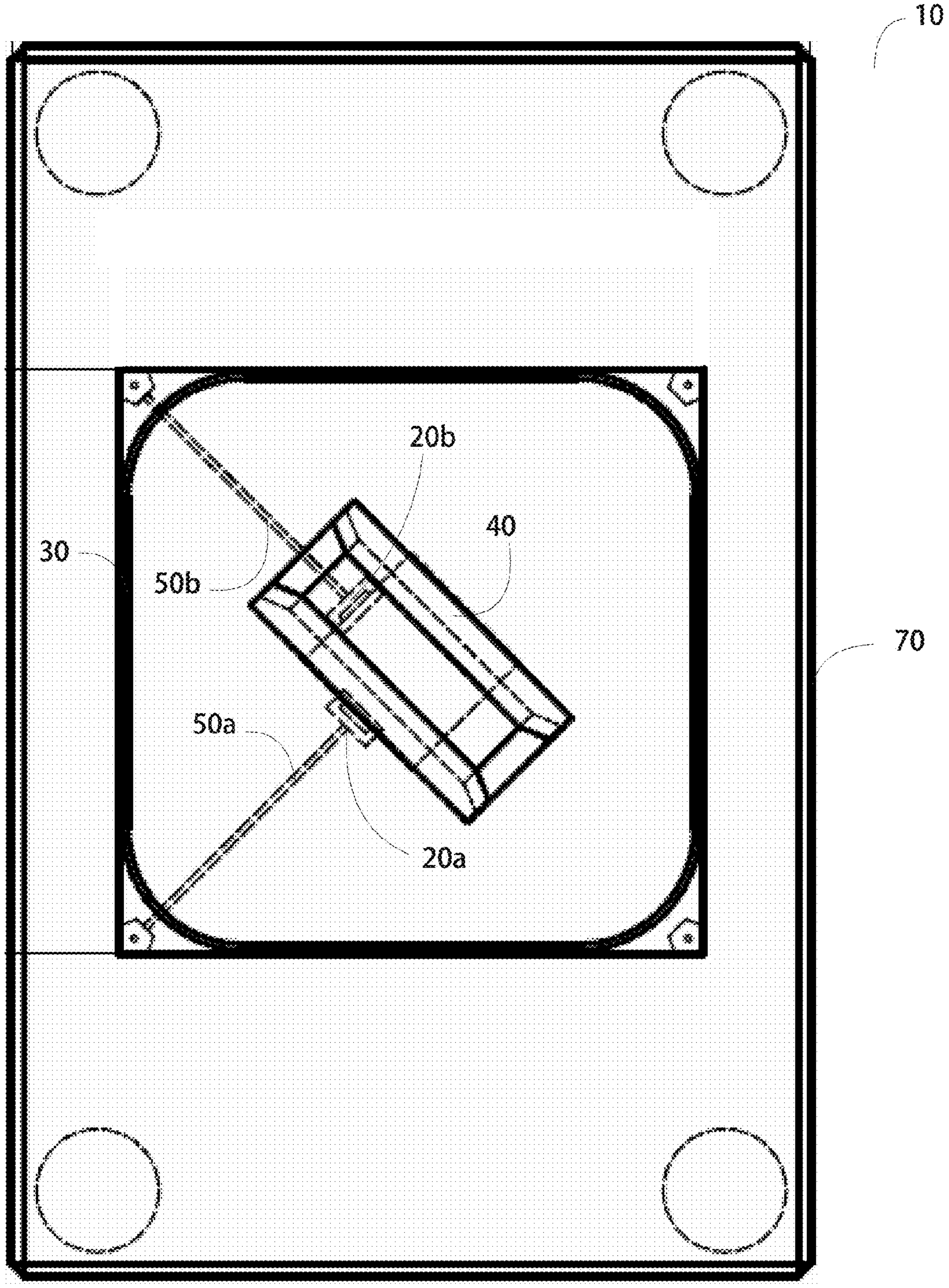
FIG. 4 shows a top plan view of the piezo shaker as shown in FIGS. 1 to 3.

As shown in FIG. 4, the two piezo elements 20*a* and 20*b* may be arranged, for example but not limited to perpendicularly, to operate independently along different directions. The first piezo element 20*a* is arranged to operate along a first direction, and the second piezo element 20*b* is arranged to operate along a second direction perpendicular to the first direction. The first direction and the second direction may, in another aspect of the invention, form an angle smaller or larger than 90 degrees. In the aspect of the invention illustrated in FIG. 4, the first piezo element 20*a* is operatively connected with the platform 30 by a first transmission means 50*a*, the first transmission means 50*a* being oriented along the first direction (see FIG. 4). In the aspect of the invention illustrated, the second piezo element 20*b* is operatively connected with the platform 30 by a second transmission means 50*b*, the second transmission means 50*b* being oriented along the second direction (see FIG. 4). When the first piezo element 20*a* is actuated the first piezo element 20*a* deforms and operates by transmitting a movement to the platform 30 through the first transmission means 50*a*. When the second piezo element 20*b* is actuated the second piezo element 20*b* deforms and operates by transmitting a movement to the platform 30 through the second transmission means 50*b*.

Independent operation of the two piezo elements 20*a* and 20*b* along different directions enables generation of a multitude of movement patterns.

In the aspect of the invention shown in FIG. 1, at least one spring bar 60 supports the platform 30. The at least one spring bar 60 rests on a base 70. The at least one spring bar 60 rests on the base 70 such that the at least one spring bar 60 is moveable in a precession-like manner. When moving in a precession-like manner, an upper end of the at least one spring bar 60 may rotate around a vertical axis passing through a lower end of the at least one spring bar 60, the lower end of the at least one spring bar 60 resting on the platform 30. The upper end of the at least one spring bar 60 supports the platform 30.

Use of the at least one spring bar 60 enables a flexible support of the platform 30 with an inherent elasticity. Furthermore, the supportive structure of the piezo shaker 10 is separated from the driving structure.

In one aspect of the invention, the first transmission means 50*a* and/or the second transmission means 50*b* may operatively connect with the platform 30 by being connected with the at least one spring bar 60. In this aspect, the first piezo element 20*a* and/or the second piezo element 20*b* operate by transmitting a movement to the at least one spring bar 60 and the platform 30.

Figure 3:
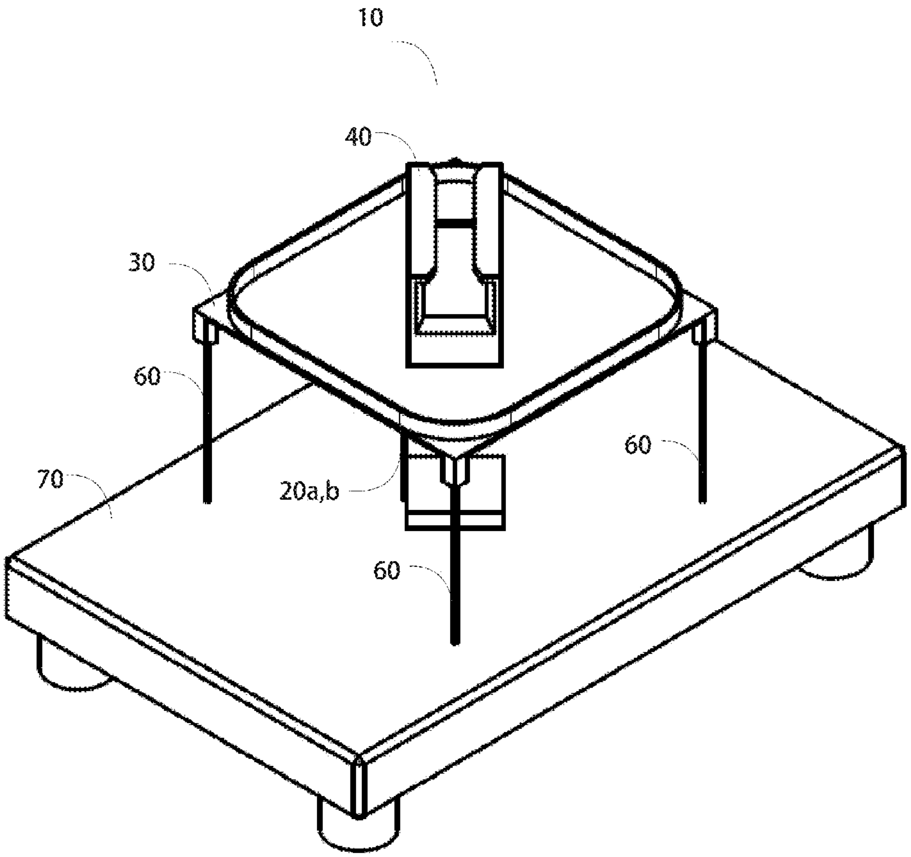
FIG. 3 shows a perspective view of the piezo shaker, as shown in FIGS. 1 and 2.

As shown in the aspect of the invention in FIGS. 3 and 4, the base 70 may be of a rectangular shape. The two piezo elements 20*a* and 20*b* may operate at approximately 45 degrees with respect to an outline of the rectangular shape of the base 70.

The first piezo element 20*a* and the second piezo element 20*b* are electrically connected to a power source (not shown). The power source provides power to apply driving voltages the first piezo element 20*a* and/or the second piezo element 20*b*.

A controller (not shown) may be control power fed to first piezo element 20*a* and the second piezo element 20*b*. By controlling power fed to the first piezo element 20*a* and the second piezo element 20*b*, operation of the first piezo element 20*a* and/or the second piezo element 20*b* may be controlled. The controller may comprise a storage. Parameters of the driving voltages applied to first piezo element 20*a* and/or the second piezo element 20*b* may be stored in the storage. Thereby a user may reproduce movement patterns by means of the stored parameters. The stored parameters may pertain to predetermined movement patterns and/or to precedent operations of the piezo shaker 10. After conclusion of an operation of the piezo shaker, the user may have the option to store parameters pertaining to concluded operation.

Use of a controller with a storage enables a user to store the parameters of an operation of the piezo shaker 10 if he wishes to repeat the operation. This may be useful when a certain movement results in particularly advantageous mixing of the sample.

The first piezo element 20*a* and the second piezo element 20*b* may be used for detecting movement of the platform 30. When driving voltages applied to the first piezo element 20*a* and/or the second piezo element 20*b* are removed, such that the first piezo element 20*a* and/or the second piezo element 20*b* begin to return towards their respective rest position, i.e. a first rest position and a second rest position. The first and the second rest position are positions of the first piezo element 20*a* and the second piezo element 20*b* when no driving voltages are applied to the first piezo element 20*a* and the second piezo element 20*b*, respectively. The returning of the first piezo element 20*a* to the first rest position reduces the deforming of the first piezo element 20*a*. The returning of the second piezo element 20*b* to the second rest position reduces the deforming of the second piezo element 20*b*. The first piezo element 20*a* and the second piezo element 20*b* generate output voltages by reducing the deforming of the first piezo element 20*a* and the second piezo element 20*b*, respectively. Such generated output voltages may be sensed and transmitted to the controller for monitoring the output voltages. The generated output voltages may also be directly transmitted to the controller.

Sensing and/or transmitting to the controller of the generated output voltages allows for detecting positions of the first piezo element 20*a* and/or the second piezo element 20*b*. The controller may comprise a signal processor for processing the output voltages transmitted to the controller. By the processing of the output voltages, the signal processor may detect positions of the first piezo element 20*a* and/or the second piezo element 20*b*. From the detected positions of the first piezo element 20*a* and/or the second piezo element 20*b* the movement of the platform 30 may be detected. Detecting the movement of the platform 30 enables monitoring the movement of the platform 30.

When the two piezo elements 20*a* and 20*b* are used for detecting the movement of the platform 30, no additional sensors are required for monitoring the movement of the platform 30. The piezo shaker 10 according to the invention thus requires less components resulting in cheaper manufacture and maintenance costs.

It is conceivable that the piezo shaker 10 further comprises position sensors for monitoring the movement of the platform 30, the at least one spring bar 60, or the two piezo elements 20*a* and 20*b*.

The present invention relates to a method for shaking a probe. The method comprises a step of placing a probe on the platform 30. The probe may be placed on the platform in a container. The container may be disposed in a rack.

The method further comprises a step of driving the platform 30 to move by means of two piezo elements 20*a* and 20*b* after the placing of the probe on the platform 30. By applying driving voltages to one or both of the two piezo elements 20*a* and 20*b*, mechanical strain within the one or both of the two piezo elements 20*a* and 20*b* results in deforming of the one or both of the two piezo elements 20*a* and 20*b*. The deforming of the one or both of two piezo elements 20*a* and 20*b* is transmitted to the platform 30, which results in a movement of the platform 30. The two piezo elements 20*a* and 20*b* may be deformed such that the two piezo elements 20*a* and 20*b* transmit the deforming to the platform 30 along different directions, for example, but not limited to, perpendicular directions.

In a subsequent step, the method comprises controlling the movement of the platform 30. The controlling may comprise sensing the deforming of the one or both of two piezo elements 20*a* and 20*b* and/or transmitting output voltages of the two piezo elements 20*a* and 20*b* to the controller. The sensing of the deforming of the one or both of two piezo elements 20*a* and 20*b* and/or the transmitting of output voltages allows for detecting of the movement of the platform 30. By detecting the movement of the platform 30, the movement of the platform 30 may be monitored and controlled.

The controlling of the movement of the platform 30 may comprise independently driving the two piezo elements 20*a* and 20*b* to oscillate. By periodically applying independent driving voltages to both of the two piezo elements 20*a* and 20*b*, the two piezo elements 20*a* and 20*b* may be independently driven to deform periodically. The independent periodic deforming of both of the two piezo elements 20*a* and 20*b* results in independent oscillatory movements of both of the two piezo elements 20*a* and 20*b*. The independent oscillatory movements of both of the two piezo elements 20*a* and 20*b* are transmitted to the platform 30 and result in driving the platform 30 to move in an oscillatory manner independently along two directions.

The controlling of the movement of the platform 30 may further comprise independently driving both of the two piezo elements 20*a* and 20*b* to oscillate at predetermined independent frequencies with independent phases and independent amplitudes.

The controlling of the movement of the platform 30 may further comprise independently driving both of the two piezo elements 20*a* and 20*b* to oscillate at predetermined dependent frequencies. The predetermined dependent frequencies may have a ratio equal to a rational number, such as for instance, but not limited to, 1, ½, ⅓, ¼ etc. The phases of both of the two piezo elements 20*a* and 20*b* may also be dependent. The phases of both of the two piezo elements 20*a* and 20*b* may have a difference of, for instance, but not limited to, 0 degrees, 45 degrees, 90 degrees, etc. The amplitudes of both of the two piezo elements 20*a* and 20*b* may also be dependent. The amplitudes of both of the two piezo elements 20*a* and 20*b* may have a ratio such as, but not limited to, 1, ½, ⅓, ¼, etc.

Figure 5:
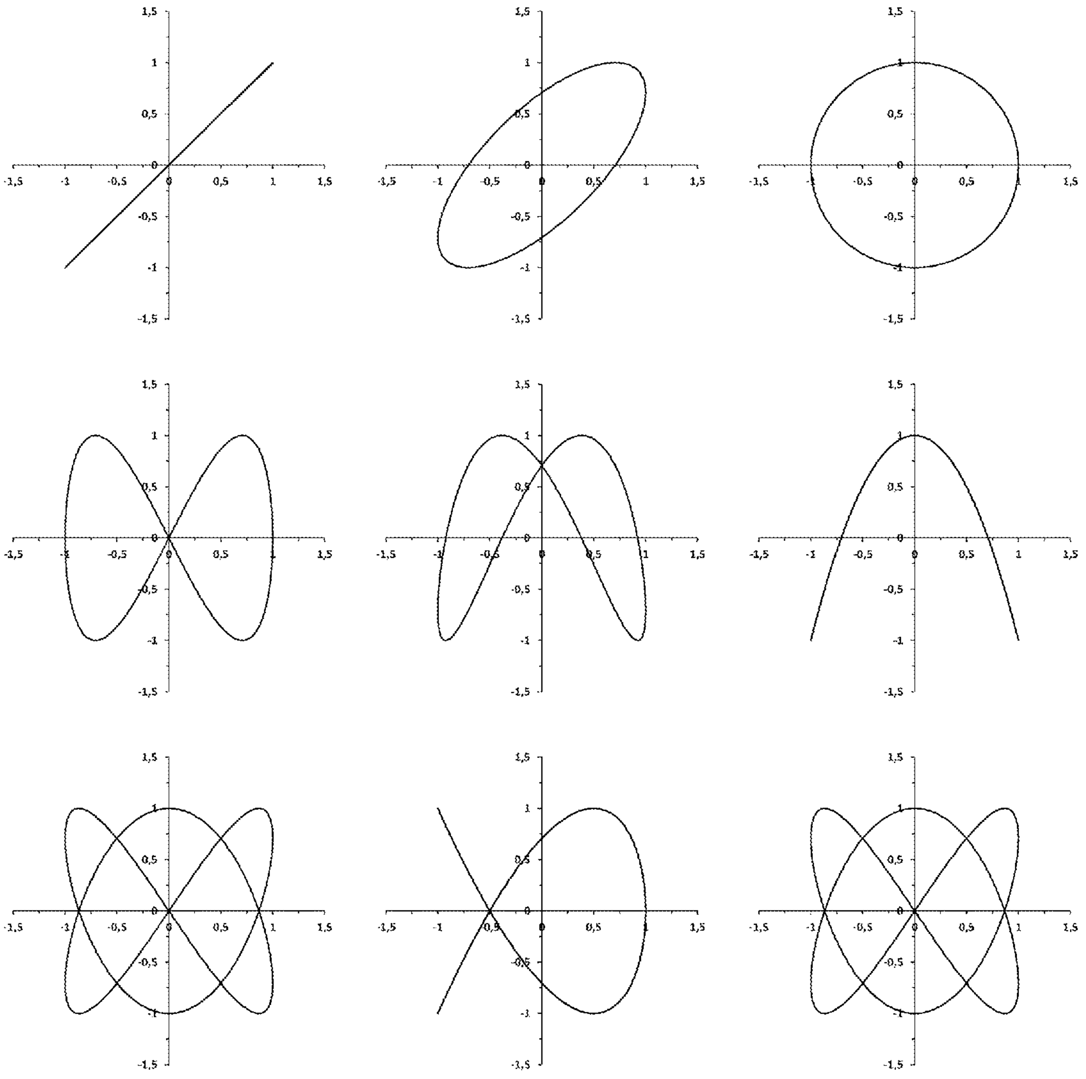
FIG. 5 shows ideal patterns of movement in a plane of any point on a platform of the piezo shaker in FIGS. 1 to 4.

FIG. 5 shows movement patterns, so-called Lissajous patterns, arising from ratios of the frequencies of the first piezo element 20*a* and of the second piezo element 20*b* equal to a rational number. The movement of the platform 30 will only approximate the movement patterns shown in FIG. 5. The reason is that movement of the platform 30 only approximately takes place in a plane.

The movement patterns shown in FIG. 5 correspond to a ratio of amplitudes of the first piezo element 20*a* and of the second piezo element 20*b* equal to one. The ratios of frequencies of the two piezo elements 20*a* and 20*b* are either 1, ½, or ⅔. The differences of the phases of the two piezo elements 20*a* and 20*b* are either 0, pi/4, or pi/2.

The controlling of the movement of the platform 30 may further comprise driving the platform 30 to move resonantly. By monitoring and controlling the movement of the platform 30, the frequencies of both of the two piezo elements 20*a* and 20*b* may be set such that the movement of the platform 30 occurs with maximal amplitudes in the different directions the two piezo elements 20*a* and 20*b* are deformed along. Driving the platform 30 to move resonantly requires comparatively less input power in respect of the output than driving the platform 30 to move non-resonantly. The frequency may be less than 150 Hz and the amplitude may be +/−1.5 mm.

The controlling of the movement of the platform 30 may further comprise receiving output voltages generated in the two piezo elements 20*a* and 20*b*. When removing driving voltages applied to the two piezo elements 20*a* and 20*b*, such that the two piezo elements 20*a* and 20*b* return towards their respective rest position, the two piezo elements 20*a* and 20*b* generate output voltages that may be sensed and/or transmitted to the controller. The output voltages generated enable detecting and monitoring the movement of the platform 30. Upon transmitting the output voltages, to the controller, the power fed to the two piezo elements 20*a* and 20*b* may be controlled.

Other sensors may be used for monitoring the positions of the two piezo elements 20*a* and 20*b*. For instance, the piezo shaker 10 may comprise positions sensors (not shown) for sensing the positions of the two piezo elements 20*a* and 20*b*, such as, but not limited to, Hall effect sensors. The position sensors would transmit data pertaining to the positions of the two piezo elements 20*a* and 20*b* to the controller.

Figure 6:
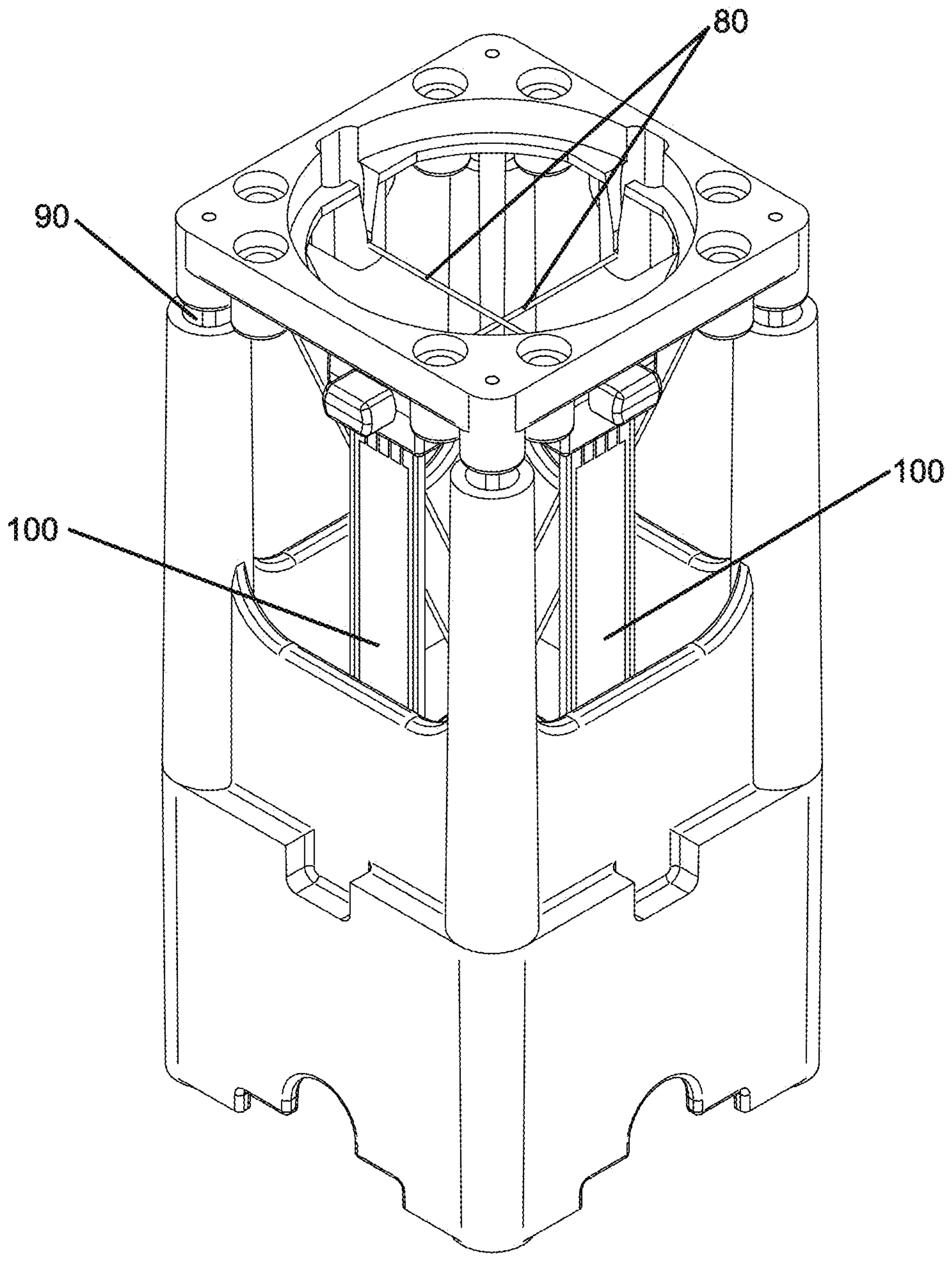
FIG. 6 shows a piezo shaker for shaking a probe comprising two piezo elements.

A further embodiment is shown in FIG. 6. A piezo shaker for shaking a probe is shown comprising two piezo elements, which are arranged to operate perpendicularly. Transmission means 80 connect the piezo elements and the platform. A spring bar 90 supports the platform. The two piezo elements 100 can be actuated to deform and the transmission means 80 transmit the movement to the platform.

Figure 7:
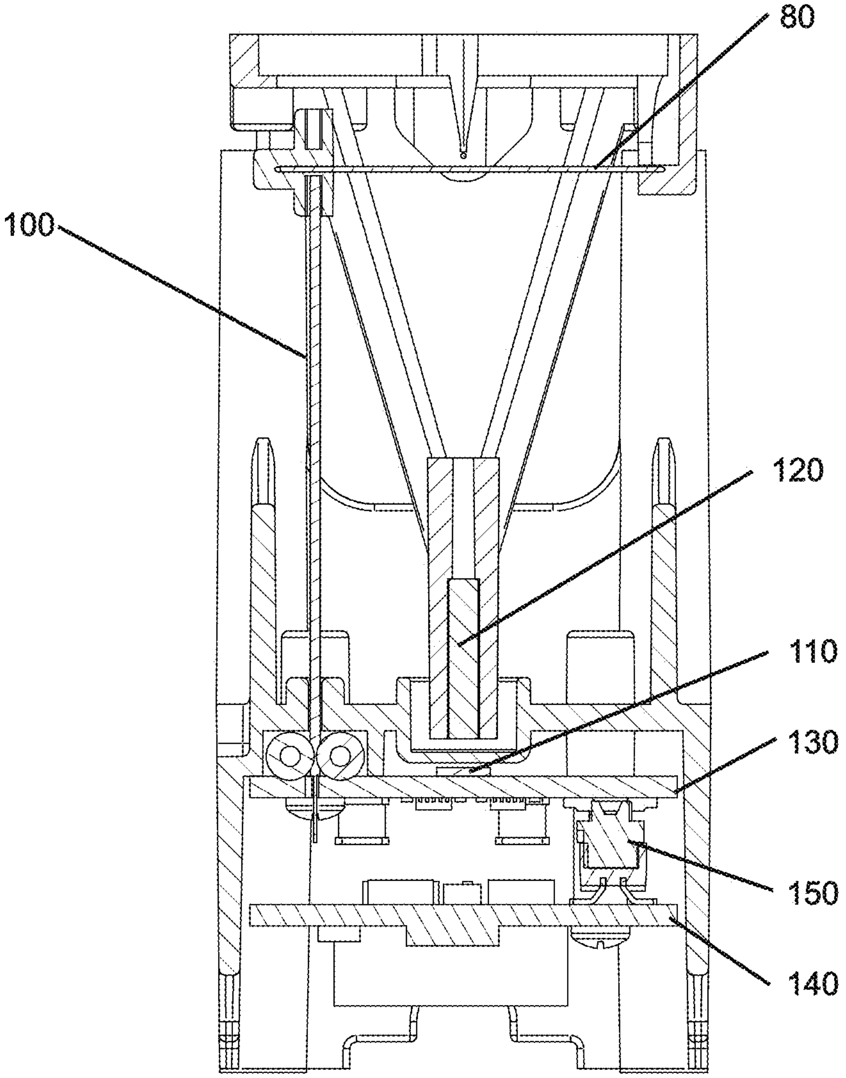
FIG. 7 shows a sectional view of a piezo shaker.

FIG. 7 shows a sectional view of the piezo shaker of FIG. 6. A transmission means 80 connects the piezo element 100 and the platform. A sensor 110 for sensing the positions of the platform in two dimensions and a magnet 120 for the sensor are also integrated. The sensor allows the controller to automatically find the resonant frequency upon initialization and to adapt the necessary parameters. A printed circuit board 130 drives the piezo elements. Another printed circuit board with controller 140 and a connector 150 are also shown. In case several piezo shakers are arranged in an array, the printed circuit board with controller 140 may be replaced by an external controller printed circuit board which is connected to the printed circuit board 130 with a flat cable and the connector 150. The external controller printed circuit board may then drive all connected piezo shakers saving further costs.

Figure 8:
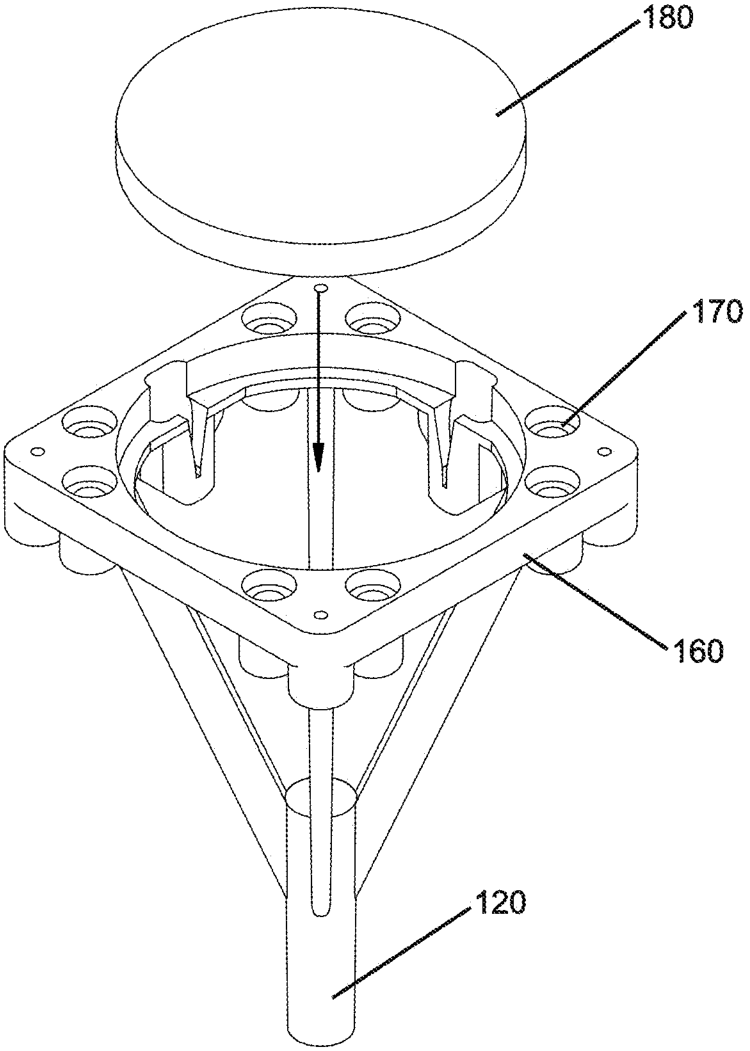
FIG. 8 shows a detailed view of the inside of a piezo shaker.

FIG. 8 shows a detailed view of the inside of the piezo shaker of FIG. 6. The platform 160 comprises eight attachment holes 170 for attachment of different platforms comprising retaining means for placing vials. An insertion weight 180 may be inserted for adapting the resonant frequency. A cylindrical magnet 120 serves for recognizing the position via a magnetic position sensor.

A platform may be replaced if necessary to change over for the use of vials of a different size. Basically, it is intended that the platform within an analyser system with the disclosed piezo shaker remains the same.

Figure 9:
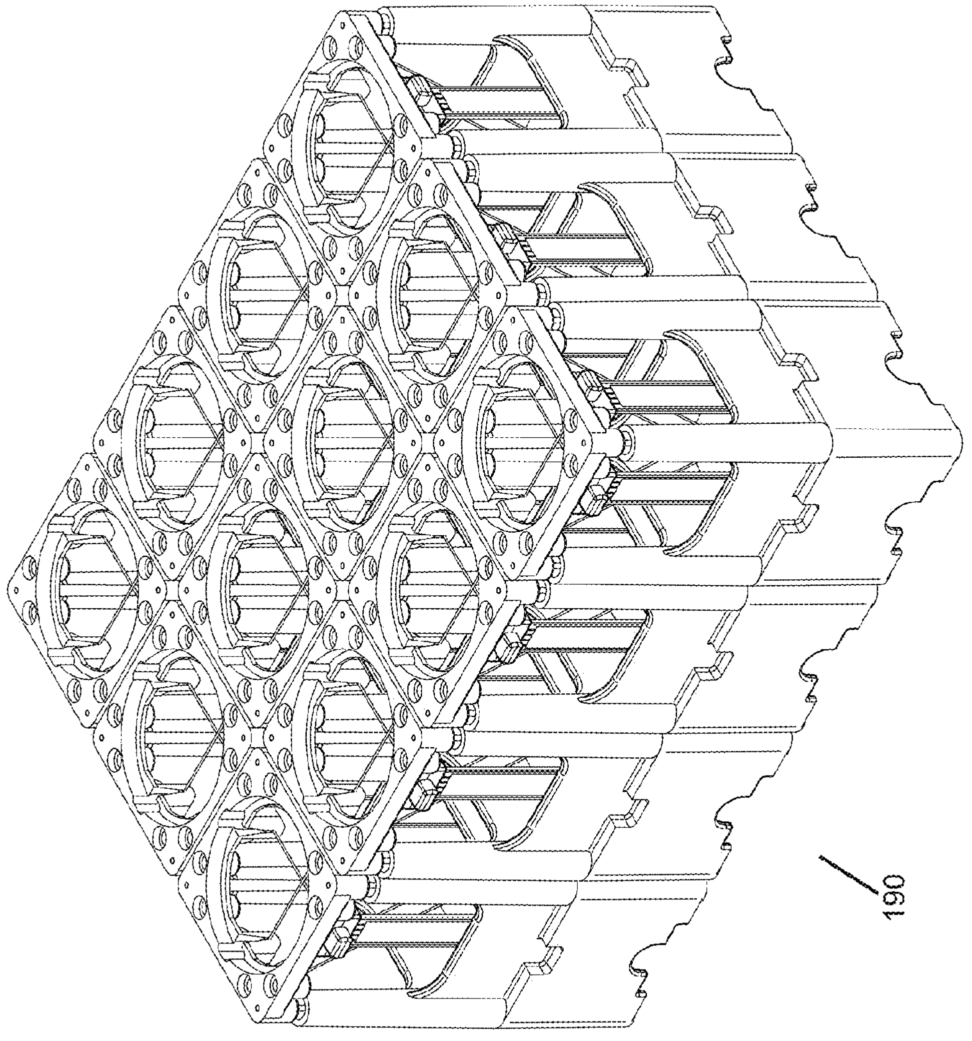
FIG. 9 shows an array comprising 12 piezo shakers.

FIG. 9 shows an array 190 comprising 12 piezo shakers. The assembly of the array is possible because the piezo shakers are modularly constructed.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

LIST OF REFERENCE NUMERALS

Piezo shaker 10
First piezo element 20*a*
Second piezo element 20*b*
Platform 30
Rack 40
First placing position 41*a*
Second placing position 41*b*
First transmission means 50*a*
Second transmission means 50*b*
Spring bar 60
Base 70
Transmission means 80
Spring bar 90
Piezo element 100
Sensor 110
Magnet 120
Printed circuit board 130
Printed circuit board with controller 140
Connector 150
Platform 160
Attachment hole 170
Insertion weight 180
Array 190

What is claimed is:

1. A piezo shaker for shaking a probe, wherein the piezo shaker comprises a platform operatively connected with at least one piezo element, wherein the at least one piezo element deforms for controlled movement of the platform, wherein the piezo shaker further comprises transmission means connecting the at least one piezo element and the platform, and wherein the transmission means transmit the movement to the platform, wherein the piezo shaker comprises a controller for controlling the power fed to the at least one piezo element and wherein the controller comprises a storage for storing patterns of operation of the piezo elements.

2. The piezo shaker according to claim 1, comprising two piezo elements arranged to operate along different directions for moving the platform.

3. The piezo shaker according to claim 1, wherein the piezo elements are arranged to operate perpendicularly.

4. The piezo shaker according to claim 1, wherein the piezo shaker comprises one or more spring bars moveably connected to and supporting the platform.

5. The piezo shaker according to claim 4, wherein the transmission means are connected to the at least one spring bar.

6. The piezo shaker according to claim 1, wherein the piezo shaker comprises a rectangular base, the at least one piezo element being arranged to operate at approximately 45 degrees with respect to an outline of the rectangular base.

7. The piezo shaker according to claim 1, wherein the piezo shaker comprises a power source electrically connected to the at least one piezo element.

8. The piezo shaker according to claim 1, wherein the piezo shaker comprises a sensor for sensing the position of the at least one piezo element.

9. A method for shaking a probe, the method comprising the steps of:

a. providing a piezo shaker for shaking a probe, wherein the piezo shaker comprises a platform operatively connected with at least one piezo element, wherein the at least one piezo element deforms for controlled movement of the platform, wherein the piezo shaker further comprises transmission means connecting the at least one piezo element and the platform, and wherein the transmission means transmit the movement to the platform, wherein the piezo shaker comprises a controller for controlling the power fed to the at least one piezo element and wherein the controller comprises a storage for storing patterns of operation of the piezo elements, b. placing the probe on the platform, c. driving the platform to move by means of the at least one piezo element, d. controlling movement of the platform with the stored patterns of operation of the piezo element.

10. The method according to claim 9, wherein the platform is driven to move by means of two piezo elements, operating along different directions.

11. The method according to claim 10, wherein the two piezo elements operate perpendicularly.

12. The method according to claim 9, wherein controlling comprises the independently driving the piezo elements to oscillate.

13. The method according to claim 9, wherein controlling comprises the use of predetermining frequencies, phases and amplitudes of the piezo elements.

14. The method according to claim 9, wherein a ratio of the frequencies of the piezo elements is a rational number.

15. The method according to claim 9, wherein controlling comprises driving the platform to move resonantly.

16. The method according to claim 9, wherein controlling comprises monitoring output voltages generated in the piezo elements.

17. A method of using a piezo shaker comprising the step of:

shaking a probe with the piezo shaker comprising a platform operatively connected with at least one piezo element, wherein the at least one piezo element deforms for controlled movement of the platform, wherein the piezo shaker further comprises transmission means connecting the at least one piezo element and the platform, and wherein the transmission means transmit the movement to the platform, wherein the piezo shaker comprises a controller for controlling the power fed to the at least one piezo element and wherein the controller comprises a storage for storing patterns of operation of the piezo elements.

18. The use according to claim 17, wherein two piezo elements are arranged to operate along different directions for shaking a probe.

19. The use according to claim 18, wherein the two piezo elements operate perpendicularly.

* * * * *